(12) United States Patent
Higuchi

(10) Patent No.: US 6,839,261 B2
(45) Date of Patent: Jan. 4, 2005

(54) SEMICONDUCTOR MEMORY DEVICE

(75) Inventor: Tsutomu Higuchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/648,376

(22) Filed: Aug. 27, 2003

(65) Prior Publication Data

US 2004/0042281 A1 Mar. 4, 2004

(30) Foreign Application Priority Data

Aug. 29, 2002 (JP) ........................................ 2002/250181

(51) Int. Cl.[7] .............................. G11C 5/02; G11C 5/06; G11C 8/00
(52) U.S. Cl. ........................ 365/51; 365/63; 365/230.03
(58) Field of Search ............................ 365/51, 52, 63, 365/185.11, 230.03

(56) References Cited

U.S. PATENT DOCUMENTS

| 6,125,061 A | 9/2000 | Mitani |
| 6,211,015 B1 | 4/2001 | Noble |
| 6,311,241 B1 * | 10/2001 | Hofmann ...................... 365/52 |
| 6,396,744 B1 * | 5/2002 | Wong ..................... 365/185.33 |
| 6,467,015 B1 * | 10/2002 | Nolan et al. ........... 365/230.03 |
| 6,614,703 B2 * | 9/2003 | Pitts et al. .............. 365/230.03 |

FOREIGN PATENT DOCUMENTS

JP    2001084777 A    3/2003

* cited by examiner

Primary Examiner—Trong Phan
(74) Attorney, Agent, or Firm—Rabin & Berdo, P.C.

(57) ABSTRACT

A semiconductor memory device comprises memory banks each including a memory cell array and a control circuit for the memory cell array and an interface circuit shared by the plural memory banks. The semiconductor memory device is adapted for performing reading of data from the plural memory banks and rewriting of data to the memory banks. In an operation mode for performing the reading, processings A1 to A4 are performed. In an operation mode for performing the rewriting, processings B1 to B3 are performed.

19 Claims, 7 Drawing Sheets

SEMICONDUCTOR MEMORY DEVICE

BACKGROUND OF THE INVENTION

This invention relates to a semiconductor memory device such as a flash module.

To increase the scale of memory capacity of a conventional semiconductor memory device, a method of increasing the size of each memory cell array of a flash memory may be employed. For example, the number of word lines of each memory cell array is increased from 512 to 1024.

As another method for increasing the scale of memory capacity of the conventional semiconductor memory device, the number of memory cell arrays provided in a flash memory may be increased. For example, the number of memory cell arrays is increased from one to four, or from four to eight. JP-A-2001-84777 discloses a flash memory having four memory cell array units (in this publication, a memory cell array unit not including a control circuit is referred to as "BANK").

However, since both of the above-described methods employ development of a new flash memory (that is, the size of memory cell arrays is increased in the former method and the number of memory cell arrays is increased in the latter method), the capability of each constituent block constituting the flash memory, the layout of the flash memory and the like needs to be redesigned. In the case the flash memory is redesigned, its interface circuit needs to be redesigned, too. Therefore, both of the above-described methods will take time for product development.

Moreover, as the size of each memory cell array is increased, the evaluation time for the flash module using an LSI tester increases. For example, in the case of evaluating a memory module that is newly developed with the size of each memory cell array doubled from 512 word lines by 512 bit lines to 1024 word lines by 512 bit lines, using an LSI tester, the test time is twice that for a memory module of the conventional size. This is because, in the case of evaluating a memory module with the double number of sectors (double number of word lines), the number of times of rewriting, which is carried out on each word line, is doubled and as a result, the practical rewrite test time for the flash module using the LSI tester is doubled, too.

SUMMARY OF THE INVENTION

The present invention may provide a semiconductor memory device that does not need redesigning of a memory cell array and a memory block having a control circuit for the memory cell array and enables increase in scale of memory capacity simply by making a simple design change of an interface circuit.

Further, the present invention may provide a semiconductor memory device that can restrain increase in test time even when the memory capacity is increased.

A semiconductor memory device according to the present invention includes memory banks each including a memory cell array and a control circuit for the memory cell array and an interface circuit shared by the plural memory banks. The semiconductor memory device is adapted for performing reading of data from the plural memory banks and rewriting of data to the plural memory banks. In an operation mode for reading, the following processing is performed: processing A1 in which the interface circuit outputs an active read enable signal to the plural memory banks; processing A2 in which the interface circuit outputs address information specifying a memory cell as a reading target to the plural memory banks; processing A3 in which each of the plural memory banks reads out data of the memory cell specified by the inputted address information and outputs the read-out data as an output data group to the interface circuit; and processing A4 in which the interface circuit selectively outputs one of plural output data groups outputted from the plural memory banks, to outside. In an operation mode for rewriting, the following processing is performed: processing B1 in which the interface circuit output address information specifying a memory cell as a rewriting target to the plural memory banks; processing B2 in which the interface circuit outputs an input data group from outside to the plural memory banks; processing B3 in which the interface circuit selectively outputs an active write enable signal to one of the plural memory banks; and processing B4 in which a memory bank to which the active write enable signal is inputted, of the plural memory banks, rewrites data of the memory cell specified by the address information to data of the input data group.

The memory bank to which the active write enable signal is inputted, of the plural memory banks, may output a busy signal indicating that it is during the processing B4, and the interface circuit may output an active write enable signal to a memory bank that is not outputting a busy signal even during a period when the interface circuit is receiving a busy signal from at least one of the plural memory banks.

Moreover, in a test mode for the plural memory banks, the following processing may be performed: processing C1 in which the interface circuit outputs address information specifying a memory cell as a rewriting target to the plural memory banks; processing C2 in which the interface circuit outputs an input data group from outside to the plural memory banks; processing C3 in which the interface circuit outputs an active write enable signal to the plural memory banks; and processing C4 in which the plural memory banks rewrite data of the memory cell specified by the address information to data of the input data group.

As described above, according to the present invention, it is possible to control the plural memory banks of the same structure as that of the conventional memory bank simply by adding a simple circuit to the interface circuit. Therefore, according to the present invention, redesigning of the memory banks themselves is not necessary and it is possible to increase the scale of memory capacity of the memory cell arrays of the memory banks simply by making a simple design change of the interface circuit. According to the present invention, since the circuit change is thus minimized, development of a semiconductor memory device can be made in a short period.

Moreover, in the present invention, in the case the function to enable activate all write enable signals in the test mode is provided, the same data can be simultaneously written into all the plural memory banks and the rewriting test time can be shortened.

Furthermore, in the present invention, in the case there is provided the function to enable output of an active write enable signal to a memory bank that is not activating a busy signal even when one of the memory banks is activating a busy signal, during data rewriting of the memory cell of one memory bank, data loading to the other memory bank and data rewriting to its memory cell can be started, and the rewriting test time using an LSI tester or the like can be shortened.

DETAILED DESCRIPTION OF THE PREFERRED EMBODIMENTS

First Embodiment

Figure 1:
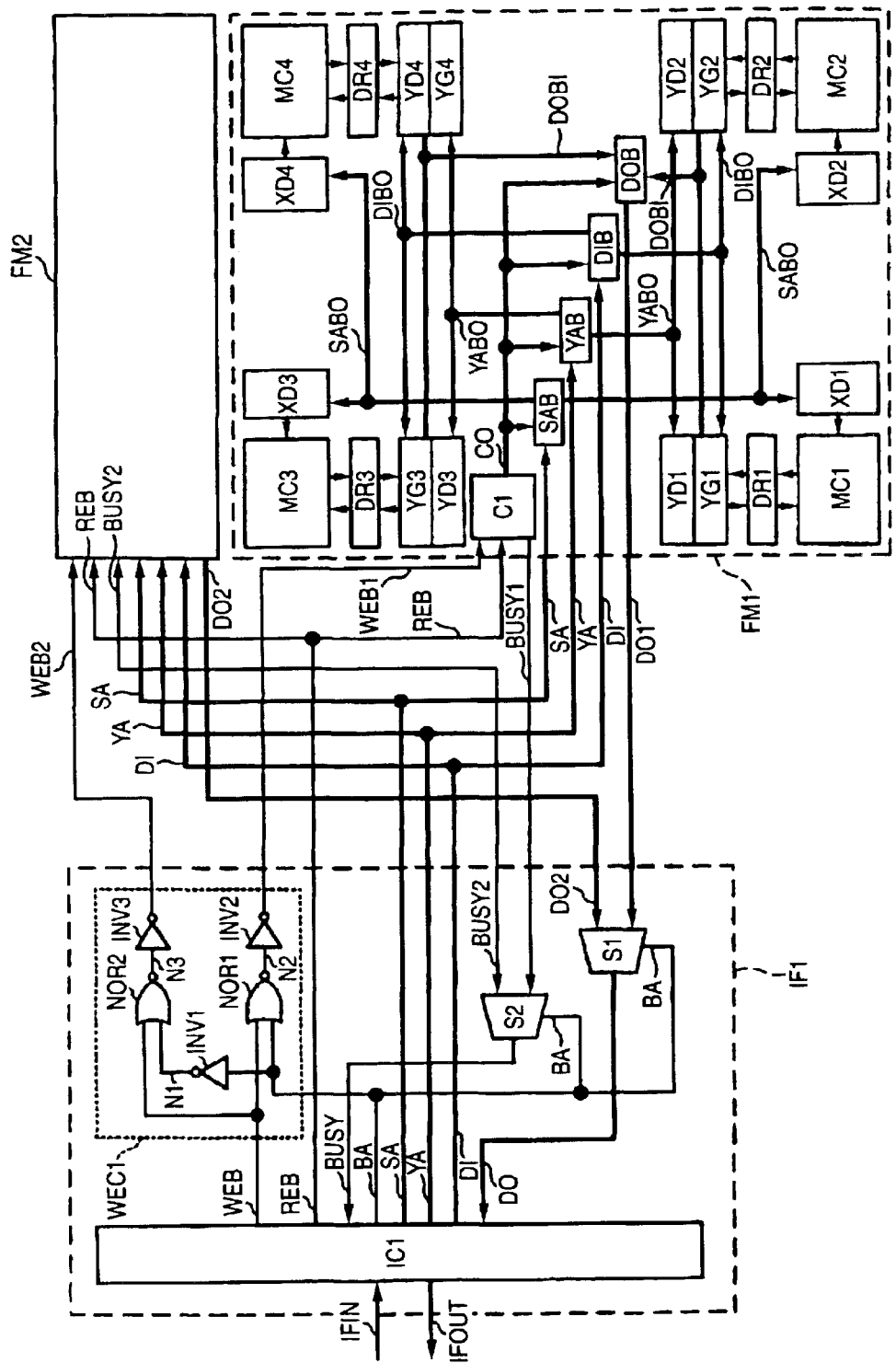
FIG. 1 is a block diagram schematically showing the structure of a flash module according to a first embodiment of the present invention.

FIG. 1 is a block diagram schematically showing the structure of a flash module according to a first embodiment of the present invention.

The flash module (semiconductor memory device) according to the first embodiment includes two flash memories (memory banks) FM1 and FM2, and an interface circuit IF1. The flash memory FM1 and the flash memory FM2 have the same structure. The flash module according to the first embodiment is built in, for example, in a system LSI, and stores a program code of MCU.

As shown in FIG. 1, each of the flash memories FM1 and FM2 has memory cell arrays MC1 to MC4, X decoder blocks XD1 to XD4, Y decoder blocks YD1 to YD4, Y gate blocks YG1 to YG4, data register blocks DR1 to DR4, a control block C1, a sector address input buffer SAB, a Y address input buffer YAB, a data input buffer DIB, and a data output buffer DOB.

The X decoder blocks XD1 to XD4 are arranged adjacently to the memory cell arrays MC1 to MC4, respectively. The data register blocks DR1 to DR4 are arranged adjacently to the memory cell arrays MC1 to MC4, respectively. The Y gate blocks YG1 to YG4 are arranged adjacently to the data register blocks DR1 to DR4, respectively. The Y decoder blocks YD1 to YD4 are arranged adjacently to the Y gate blocks YG1 to YG4, respectively.

A write enable signal WEB1 (or WBE2) and a read enable signal REB outputted from the interface circuit IF1 are inputted to the control block C1. The control block C1 receives the write enable signal WEB1 (or WEB2) and the read enable signal REB and executes data rewriting of a memory cell, reading of a memory cell and the like. The control block C1 outputs an internal control signal group CO based on the inputted write enable signal WEB 1 (or WEB2) and read enable signal REB to the sector address input buffer SAB, the Y address input buffer YAB, the data input buffer DIB and the data output buffer DOB.

To the sector address input buffer SAB, a sector address group SA outputted from the interface circuit IF1 and the internal control signal group CO outputted from the control block C1 are inputted. The sector address input buffer SAB is controlled on the basis of the inputted internal control signal group CO. The sector address input buffer SAB converts the inputted sector address group SA to an internal sector address group SABO and outputs the internal sector address group SABO to the X decoder blocks XD1 to XD4.

To the Y address input buffer YAB, a Y address group YA outputted from the interface circuit IF1 and the internal control signal group CO outputted from the control block C1 are inputted. The Y address input buffer YAB is controlled on the basis of the inputted internal control signal group CO. The Y address input buffer YAB converts the inputted Y address group YA to an internal Y address group YABO and outputs the internal Y address group YABO to the Y decoder blocks YD1 to YD4.

To the data input buffer DIB, an input data group DI outputted from the interface circuit IF1 and the internal control signal group CO outputted from the control block C1 are inputted. The data input buffer DIB is controlled on the basis of the inputted internal control signal group CO. The data input buffer DIB converts the inputted input data group DI to an internal input data group DIBO and outputs the internal input data group DIBO to the Y gate blocks YG1 to YG4.

To the data output buffer DOB, an input internal output data group DOBI outputted from the Y gate blocks YG1 to YG4 and the internal control signal group CO outputted from the control block C1 are inputted. The data output buffer DOB is controlled on the basis of the inputted internal control signal group CO. The data output buffer DOB converts the input internal output data group DOBI to an output data group DO1 (or DO2) and outputs the output data group to the interface circuit IF1.

In each of the memory cell arrays MC1 to MC4, memory cells for storing data are arranged in a matrix. Each of the memory cell arrays MC1 to MC4 has 512 word lines arrayed in parallel, 512 bit lines arrayed in parallel in a direction intersecting the word lines, and the memory cells arranged at the points of intersection of the word lines and the bit lines. The number of word lines and the number of bit lines are not limited to the above-described numbers. The number of memory cell arrays is not limited to four, either.

Each of the data register blocks DR1 to DR4 temporarily stores data to be written to a memory cell at the time of data loading in the rewriting operation. Each of the data register blocks DR1 to DR4 has a latch circuit for storing data every bit line. Each of the data register blocks DR1 to DR4 transmits the stored data to a memory cell of a selected sector address through the bit line, thereby rewriting data stored in the memory cell.

Each of the Y gate blocks YG1 to YG4 has a transistor group arranged every bit line and adapted for sending and receiving data to and from the bit line. Each of the Y gate blocks YG1 to YG4 outputs data of a selected memory cell as an internal output data group DOBI at the time of data reading operation. At the time of data loading in the rewriting operation, the Y gate blocks YG1 to YG4 convert input data to an internal input data group DIBO and transmit the internal input data group DIBO to the data register blocks DR1 to DR4, respectively.

To the X decoder blocks XD1 to XD4, the same internal sector address group SABO is inputted. The X decoder blocks XD1 to XD4 decode the internal sector address group SABO and simultaneously select arbitrary word lines in the memory cell arrays MC1 to MC4, respectively.

To the Y decoder blocks YD1 to YD4, the same internal Y address group YABO is inputted. The Y decoder blocks YD1 to YD4 decode the internal Y address group YABO.

In accordance with the Y address group YA, arbitrary Y gates in the Y gate blocks YG1 to YG4 are simultaneously selected and arbitrary latch circuits in the data register blocks DR1 to DR4 are simultaneously selected. Also arbitrary bit lines in the memory cell arrays MC1 to MC4 are simultaneously selected. In accordance with the sector address group SA and the Y address group YA, arbitrary memory cells are selected.

The interface circuit IF1 enables operations in a ROM writer, an LSI tester, a CPU mode and a serial mode. In each of these modes, the interface circuit IF1 converts a signal from outside of the flash module so as to operate the flash memory FM1 or FM2. The interface circuit IF1 has an interface core block IC1, a write enable signal control circuit WEC1, a selector element S1, and a selector element S2.

The interface core block IC1 has a structure in which a function to output a bank address group BA for selecting one of the flash memories FM1 and FM2 is added to a conventional interface circuit. The interface core block IC1 outputs the write enable signal WEB and the bank address group BA to the write enable signal control circuit WEC1. The interface core block IC1 outputs the bank address group BA to the selector element S1 for selectively outputting an output data group and the selector element S2 for selectively outputting a busy signal. The interface core block IC1 outputs the read enable signal REB, the sector address group SA, the Y address group YA and the input data group DI to the flash memories FM1 and FM2.

To the interface core block IC1, an output data group DO outputted from the selector element S1 and a busy signal BUSY outputted from the selector element S2 are inputted. The busy signal BUSY indicates whether the flash memory FM1 or FM2 is performing the rewriting operation or not. Also an external input signal IFIN, which is an input signal to the flash module, is inputted to the interface core block IC1. The interface core block IC1 outputs an external output signal IFOUT, which is a flash module output signal.

The write enable signal control circuit WEC1 includes inverter elements INV1 to INV3, and NOR elements NOR1 and NOR2. The write enable signal WEB is inputted to one input terminal of each of the NOR elements NOR1 and NOR2, and the bank address group BA is inputted to the other input terminal of the NOR element NOR1 and the input terminal of the inverter element INV1. An output of the inverter element INV1 is inputted to the other input terminal of the NOR element NOR2 via a node N1. An output of the NOR element NOR1 is inputted to the input terminal of the inverter terminal INV2 via a node N2. An output of the NOR element NOR2 is inputted to the input terminal of the inverter element INV3 via a node N3. An output of the inverter element INV2 is inputted to the flash memory FM1 as the write enable signal WEB1.

The output data group DO1 and DO2 from the flash memories FM1 and FM2 are inputted to the input terminal of the selector element S1, and the bank address group BA is inputted to the selector terminal of the selector element S1. The selector element S1 outputs the output data group DO to the interface core block IC1. When the bank address group BA has a ground potential Vss, the selector element S1 outputs the output data group DO1 as the output data group DO. When the bank address group BA has a power-supply potential Vdd, the selector element S1 outputs the output data group DO2 as the output data group DO.

Busy signals BUSY1 and BUSY2 from the flash memories FM1 and FM2 are inputted to the input terminal of the selector element S2, and the bank address group BA is inputted to the selector terminal of the selector element S2. The selector element S2 outputs the busy signal BUSY to the interface core block IC1. When the bank address group BA has a ground potential Vss, the selector element S2 outputs the busy signal BUSY1 as the busy signal BUSY. When the bank address group BA has a power-supply potential Vdd, the selector element S2 outputs the busy signal BUSY2 as the busy signal BUSY.

Figure 2:
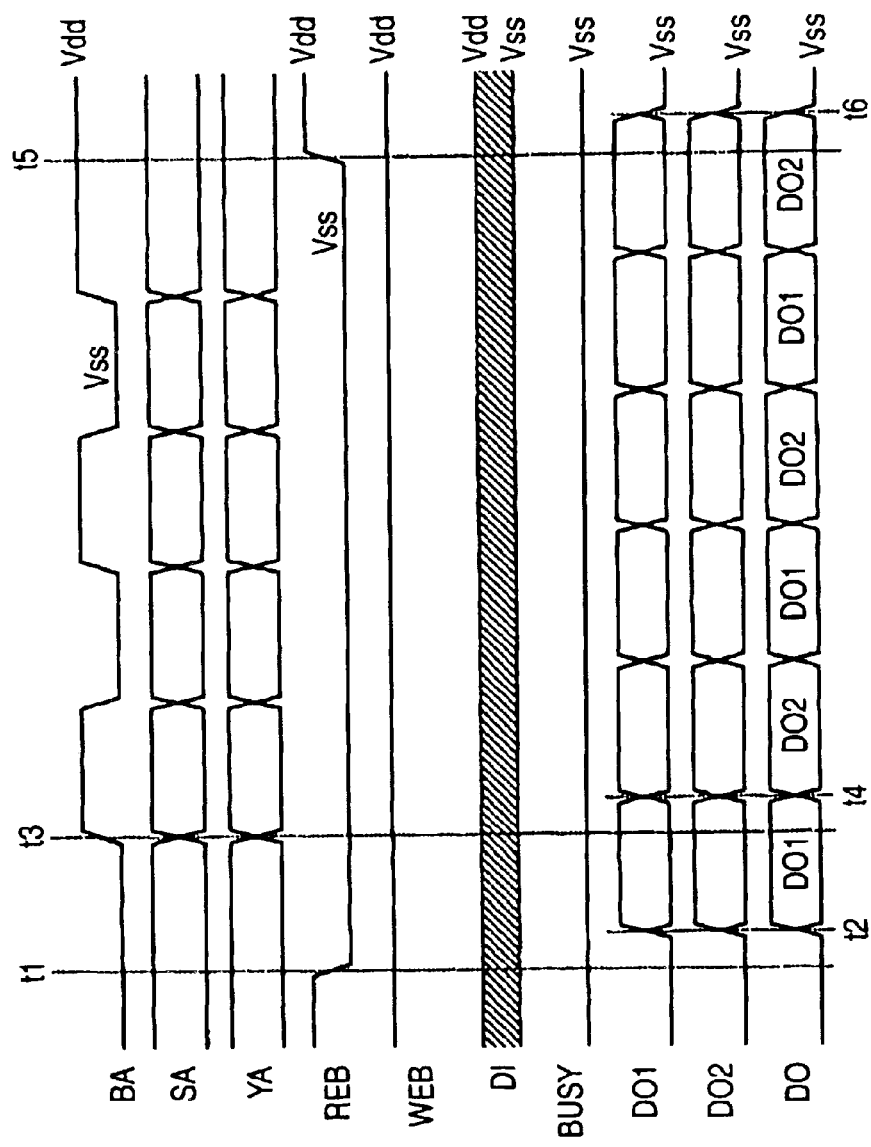
FIG. 2 is a timing chart for explaining a reading operation in the flash module of FIG. 1.

FIG. 2 is a timing chart for explaining the reading operation in the flash module according to the first embodiment.

As shown in FIG. 2, in the initial state, the bank address group BA has the ground potential Vss, and the sector address group SA and the Y address group YA select arbitrary addresses. The read enable signal REB has the power-supply potential Vdd, and the output data groups DO1 and DO2 and the output data group DO have the ground potential Vss.

In the reading operation period (reading operation mode), the read enable signal REB has the power-supply potential Vdd, and the write enable signal WEB and the write enable signals WEB1 and WEB2 have the power-supply potential Vdd. The busy signals BUSY1 and BUSY2 and the busy signal BUSY have the ground potential Vss, and the input data group DI may have the power-supply potential Vdd or the ground potential Vss.

Next, when the read enable signal REB is turned to the ground potential Vss (time point t1), data of memory cells of arbitrary addresses selected by the sector address group SA and the Y address group YA in the flash memories FM1 and FM2 are read out and outputted as the output data groups DO1 and DO2 (time point t2). At this point, since the bank address group BA has the ground potential Vss, the output data group DO1 is selected by the selector element S1 and the output data group DO1 is outputted as the output data group DO.

Next, when the bank address group BA is switched to the power-supply potential Vdd and addresses selected by the sector address group SA and the Y address group YA are switched (time point t3), data of newly selected memory cells in the flash memories FM1 and FM2 are read out and outputted as the output data groups DO1 and DO2, respectively (time point t4). At this point, since the bank address group BA has the power-supply potential Vdd, the output data group DO2 is selected by the selector element S1 and the output data group DO2 is outputted as the output data group DO. As an operation similar to the operation from the time point t3 to the time point t4 is repeated, data is continuously read out from the flash memories FM1 and FM2.

After that, when the read enable signal REB is turned to the power-supply potential Vdd (time point t5), the output data groups DO1 and DO2 and the output data group DO have the ground potential Vss and the reading operation ends (time point t6).

Figure 3:
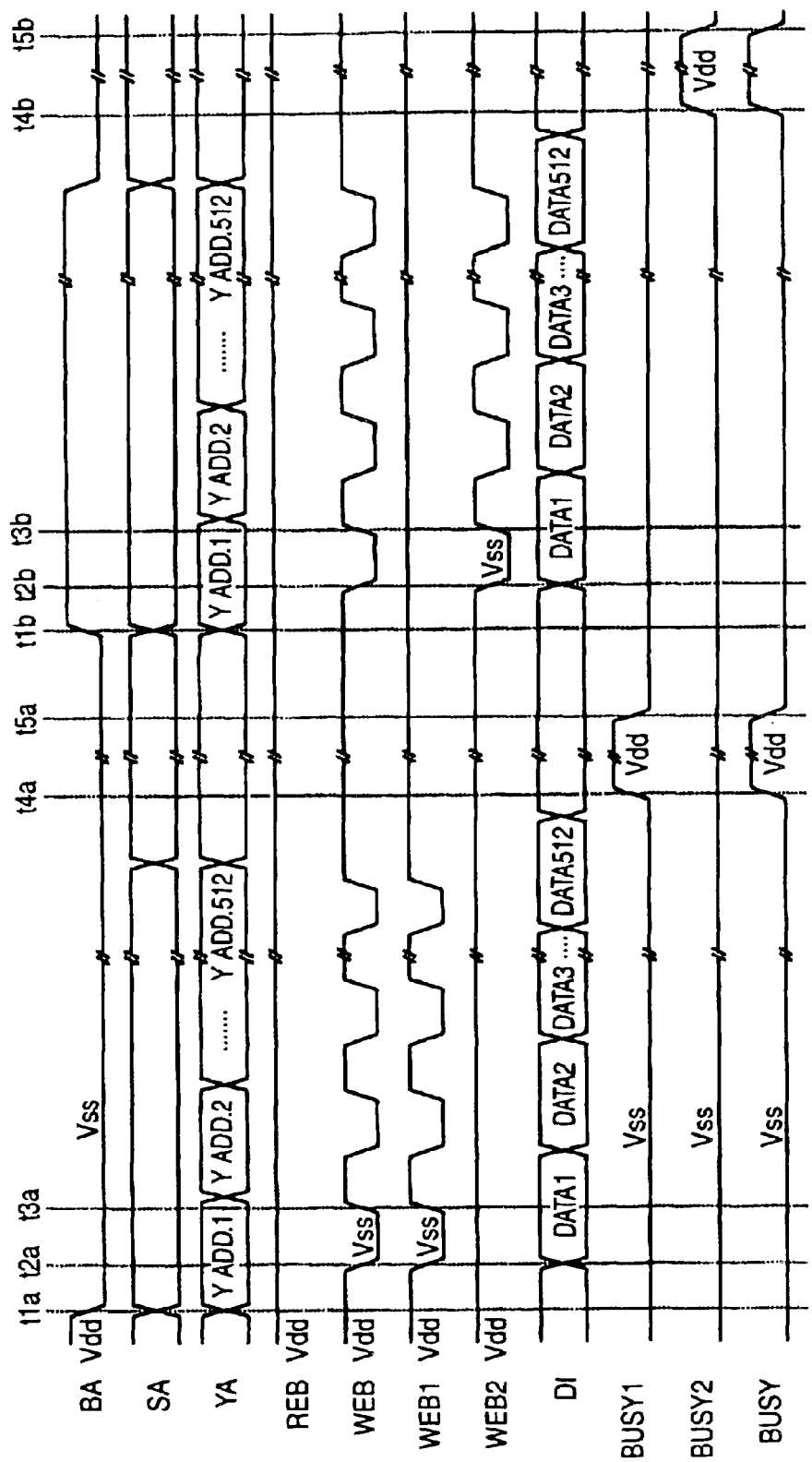
FIG. 3 is a timing chart for explaining a rewriting operation in the flash module of FIG. 1.

FIG. 3 is a timing chart for explaining the rewriting operation in the flash module according to the first embodiment. In this case, an operation to rewrite data of a memory cell in a sector of an arbitrary address in the flash memory FM1 and then rewrite data of a memory cell in a sector of an arbitrary address in the flash memory FM2 will be described.

As shown in FIG. 3, in the initial state, the bank address group BA has the power-supply potential Vdd, and the write enable signal WEB has the power-supply potential Vdd. The busy signals BUSY1 and BUSY2 and the busy signal BUSY have the ground potential Vss. The sector address group SA and the Y address group YA select arbitrary addresses. The input data group DI has arbitrary data. All the nodes N1 to N3 have the ground potential Vss, and both of the write enable signals WEB1 and WEB2 have the power-supply potential Vdd. During the rewriting operation period (rewriting operation mode), the read enable signal REB is held at the power-supply potential Vdd.

Next, when the bank address group BA is switched to the ground potential Vss to select the flash memory FM1, and the node N1 is switched to the power-supply potential Vdd. The sector address group SA is switched to the address of a sector (word line) in which rewriting is to be executed, and the Y address group YA is switched to the address of the latch circuit of the data register blocks DR1 to DR4 to which data is to be loaded first (time point t1a). The bank address group BA and the sector address group SA maintain this state during the loading.

Next, when the write enable signal WEB is turned to the ground potential Vss, the node N2 is switched to the power-supply potential Vdd and the write enable signal WEB1 is switched to the ground potential Vss. At the leading edge of this write enable signal WEB1, the latch circuit of the target one of the data register blocks DR1 to DR4 in the flash memory FM1 is selected, and the input data group DI becomes data to be loaded to the latch circuit (time point t2a). Then, as the write enable signal WEB is turned to the power-supply potential Vdd, the node N2 is switched to the ground potential Vss and the write enable signal WEB1 is switched to the power-supply potential Vdd. At the leading edge of this write enable signal WEB1, the data of the input data group DI of the flash memory FM1 is loaded to the target one of data register blocks DR1 to DR4 (time point t3a). Next, the Y address group YA selects the address of the latch circuit of the data register blocks DR1 to DR4 of the flash memory FM1 to which the second data is to be loaded, and in such a manner, an operation similar to the operation from the time point t1a to the time point t3a is executed to the latch circuits of all the data register blocks DR1 to DR4, for example, 512 cycles.

When data loading to the latch circuits of all the data register blocks DR1 to DR4 of the flash memory FM1 is completed, the flash memory FM1 itself automatically starts the rewriting operation to all the memory cells selected by the sector address group SA using the data of the data register blocks DR1 to DR4. The busy signal BUSY1 is switched to the power-supply potential Vdd and the busy signal BUSY is switched to the power-supply potential Vdd via the selector element S2 (time point t4a).

During the period when the busy signal BUSY has the power-supply potential Vdd, access to the flash memories FM1 and FM2 is inhibited. When the rewriting operation is completed, the busy signal BUSY1 is switched to the ground potential Vss and the busy signal BUSY is switched to the ground potential Vss via the selector element S2. The inhibition of access to the flash memories FM1 and FM2 is canceled and the rewriting operation to the flash memory FM1 ends (time point t5a).

Next, the bank address group BA is switched to the power-supply potential Vdd to select the flash memory FM2, the node N1 is switched to the ground potential Vss, the sector address group SA is switched to the address of a sector (word line) in which rewriting is to be executed, and the Y address group YA is switched to the address of the latch circuit of the data register blocks DR1 to DR4 to which data is to be loaded first. In such a manner, the operation from the time point t1b to the time point t5b (rewriting operation to the flash memory FM2) is executed similarly to the foregoing operation from the time point t1a to the time point t5a (rewriting operation to the flash memory FM1).

As described above, in the flash module according to the first embodiment, the function to output the bank address BA is added to the interface core block IC1 of the interface circuit IF1, and the selector element S1 and the write enable signal selector circuit WEC1 are additionally provided in the interface circuit IF1, thereby enabling control of the plural flash memories having the same structure as that of the conventional flash memory. Therefore, with the flash module according to the first embodiment, redesigning of the flash memories themselves is not necessary and it is possible to increase the scale of memory capacity of the memory cell arrays of the flash module simply by making a simple design change of the interface circuit. With the flash module according to the first embodiment, since the circuit change is thus minimized, development of the flash module can be made in a short period.

Moreover, with the flash module according to the first embodiment, since the circuit newly added to the interface circuit is small-scaled, the increase in layout size of the interface circuit can be minimized.

Second Embodiment

Figure 4:
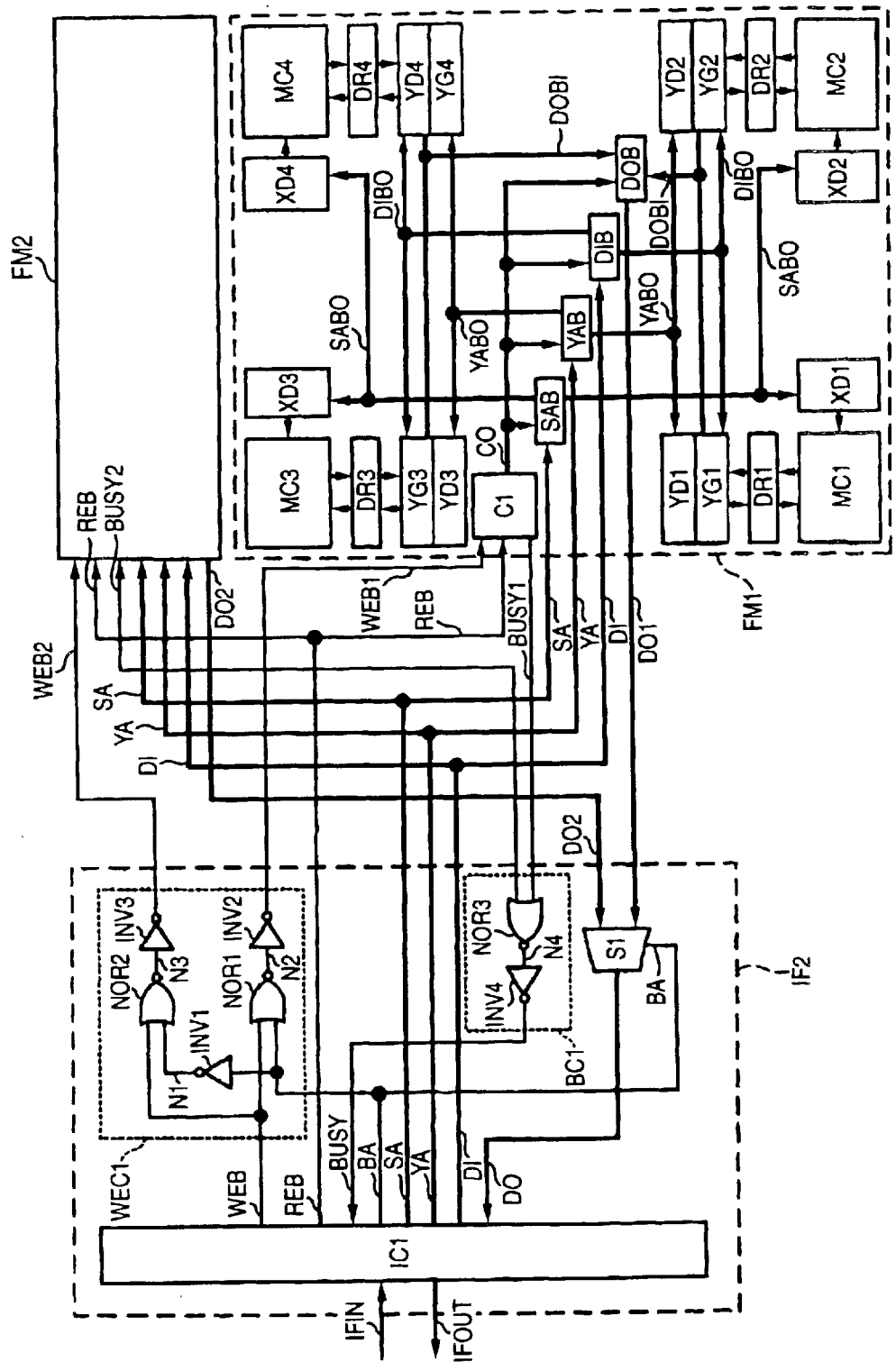
FIG. 4 is a block diagram schematically showing the structure of a flash module according to a second embodiment of the present invention.

FIG. 4 is a block diagram schematically showing the structure of a flash module according to a second embodiment of the present invention.

The structure of flash memories FM1 and FM2 is the same as the structure described in the first embodiment. External signals inputted to and outputted from the flash memories FM1 and FM2 are the same as those described in the first embodiment. The flash module (semiconductor memory device) according to the second embodiment includes the two flash memories (memory banks) FM1 and FM2, and one interface circuit IF2.

The interface circuit IF2 has an interface core block IC1, a write enable signal control circuit WEC1, a selector element S1, and a busy signal control circuit BC1. The structures of the interface core block IC1, the write enable signal control circuit WEC1 and the selector element S1 are the same as those described in the first embodiment.

The busy signal control circuit BC1 includes a NOR element NOR3 and an inverter element INV4. Busy signals BUSY1 and BUSY2 are inputted to the input terminals of the NOR element NOR3, respectively, and an output of the NOR element NOR3 is inputted to the input terminal of the inverter element INV4 via a node N4. A busy signal BUSY outputted from the output terminal of the inverter element INV4 is inputted to the interface core block IC1. The interface circuit IF2 is so constituted that even when one of the flash memories FM1 or FM2 is performing a rewriting operation and its busy signal BUSY1 or BUSY2 and the busy signal BUSY have a power-supply potential Vdd, the other flash memory with its busy signal not having the power-supply potential Vdd can be accessed for the rewriting operation.

A data reading operation in the flash module according to the second embodiment is the same as the data reading operation in the flash module according to the first embodiment.

Figure 5:
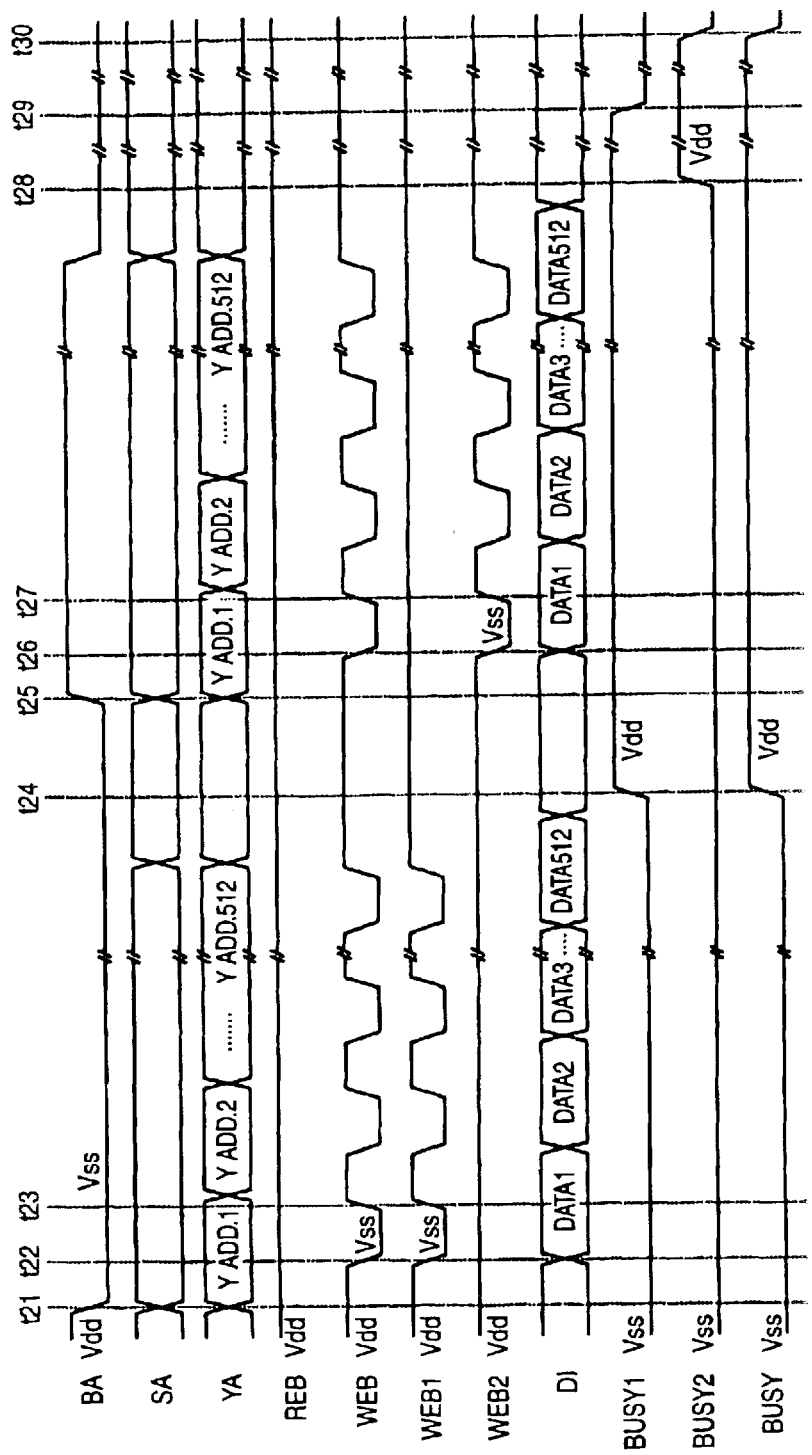
FIG. 5 is a timing chart for explaining a rewriting operation in the flash module of FIG. 4.

FIG. 5 is a timing chart for explaining the rewriting operation in the flash module according to the second embodiment. In this case, an operation to rewrite data of a memory cell in a sector of an arbitrary address in the flash memory FM1 and then rewrite data of a memory cell in a sector of an arbitrary address in the flash memory FM2 will be described.

As shown in FIG. 5, in the initial state, the bank address group BA has the power-supply potential Vdd, and the write enable signal WEB has the power-supply potential Vdd. The busy signals BUSY1 and BUSY2 have the ground potential Vss. The sector address group SA and the Y address group YA select arbitrary addresses. The input data group DI has arbitrary data. All the nodes N1 to N3 have the ground potential Vss, and both of the write enable signals WEB1 and WEB2 have the power-supply potential Vdd. The node N4 has the power-supply potential Vdd and the busy signal BUSY has the ground potential Vss. During the rewriting operation period (rewriting operation mode), the read enable signal REB is held at the power-supply potential Vdd.

Next, when the bank address group BA is switched to the ground potential Vss to select the flash memory FM1, and the node N1 is switched to the power-supply potential Vdd. The sector address group SA is switched to the address of a sector (word line) in which rewriting is to be executed, and the Y address group YA is switched to the address of the latch circuit of the data register blocks DR1 to DR4 to which data is to be loaded first (time point t21).

The bank address group BA and the sector address group SA maintain this state during the loading. When the write enable signal WEB is turned to the ground potential Vss, the node N2 is switched to the power-supply potential Vdd and the write enable signal WEB1 is switched to the ground potential Vss. At the leading edge of this write enable signal WEB1, the latch circuit of the target one of the data register blocks DR1 to DR4 in the flash memory FM1 is selected, and the input data group DI becomes data to be loaded to the latch circuit (time point t22).

Next, as the write enable signal WEB is switched to the power-supply potential Vdd, the node N2 is switched to the ground potential Vss and the write enable signal WEB1 is switched to the power-supply potential Vdd. At the leading edge of this write enable signal WEB1, the data of the input data group DI of the flash memory FM1 is taken into the latch circuit of the target one of data register blocks DR1 to DR4 (time point t23).

Next, the Y address group YA selects the address of the latch circuit of the data register blocks DR1 to DR4 of the flash memory FM1 to which the second data is to be loaded, and in such a manner, an operation similar to the operation from the time point t21 to the time point t23 is executed to the latch circuits of all the data register blocks DR1 to DR4, for example, 512 cycles.

When data loading to the latch circuits of all the data register blocks DR1 to DR4 of the flash memory FM1 is completed, the flash memory FM1 itself automatically starts the rewriting operation to all the memory cells selected by the sector address group SA using the data of the data register blocks DR1 to DR4. The busy signal BUSY1 is switched to the power-supply potential Vdd and the node N4 of the busy signal control circuit BC1 is switched to the ground potential Vss. The busy signal BUSY is switched to the power-supply potential vdd (time point t24).

Next, the bank address group BA is switched to the power-supply potential Vdd to select the flash memory FM2, the node N1 is switched to the ground potential Vss, the sector address group SA is switched to the address of a sector (word line) in which rewriting is to be executed, and the Y address group YA is switched to the address of the latch circuit of the data register blocks DR1 to DR4 to which data is to be loaded first (time point t25).

The bank address group BA and the sector address group SA maintain this state during the loading. When the write enable signal WEB is turned to the ground potential Vss, the node N3 is switched to the power-supply potential vdd and the write enable signal WEB2 is switched to the ground potential Vss. At the leading edge of this write enable signal WEB2, the latch circuit of the target one of the data register blocks DR1 to DR4 in the flash memory FM2 is selected, and the input data group DI becomes data to be loaded to the latch circuit (time point t26).

Next, as the write enable signal WEB is switched to the power-supply potential Vdd, the node N3 is switched to the ground potential Vss and the write enable signal WEB2 is switched to the power-supply potential Vdd. At the leading edge of this write enable signal WEB2, the data of the input data group DI of the flash memory FM2 is taken into the latch circuit of the target one of data register blocks DR1 to DR4 (time point t27). Next, the Y address group YA selects the address of the latch circuit of the data register blocks DR1 to DR4 of the flash memory FM2 to which the second data is to be loaded, and in such a manner, an operation similar to the operation from the time point t25 to the time point t27 is executed to the latch circuits of all the data register blocks DR1 to DR4, for example, 512 cycles.

When data loading to the latch circuits of all the data register blocks DR1 to DR4 of the flash memory FM2 is completed, the flash memory FM2 itself automatically starts the rewriting operation to all the memory cells selected by the sector address group SA using the data of the data register blocks DR1 to DR4. The busy signal BUSY2 is switched to the power-supply potential Vdd. At this point, node N4 has the ground potential Vss and the busy signal BUSY is held at the power-supply potential Vdd (time point t28).

Next, when the rewriting operation to the flash memory FM1 is completed, the busy signal BUSY1 is switched to the ground potential Vss. At this point, the busy signal BUSY1 has the ground potential Vss and the busy signal BUSY2 has the power-supply potential Vdd. The node N4 has the ground potential Vss and the busy signal BUSY is held at the power-supply potential Vdd (time point t29).

Next, when the rewriting operation to the flash memory FM2 is completed, the busy signal BUSY2 is switched to the ground potential Vss. At this point, the busy signals BUSY1 and BUSY2 have the ground potential Vss and the node N4 has the power-supply potential Vdd. The busy signal BUSY is switched to the ground potential Vss and the rewriting operation to the flash memories FM1 and FM2 is completed (time point t30).

As described above, in the flash module according to the second embodiment, the function to output the bank address BA is added to the interface core block IC1 of the interface circuit IF2, and the selector element S1 and the write enable signal selector circuit WEC1 are additionally provided in the interface circuit IF2, thereby enabling control of the plural flash memories having the same structure as that of the conventional flash memory. Therefore, with the flash module according to the second embodiment, redesigning of the flash memories themselves is not necessary and it is possible to increase the scale of memory capacity of the memory cell arrays of the flash module simply by making a simple design change of the interface circuit. With the flash module according to the second embodiment, since the circuit change is thus minimized, development of the flash module can be made in a short period.

Moreover, with the flash module according to the second embodiment, since the interface circuit IF2 is equipped with the circuit BC1 for performing OR processing of the busy signals BUSY1 and BUSY2 of the plural flash memories FM1 and FM2 is provided, during data rewriting of the memory cell of one of the flash memories, data loading to the other flash memory and data rewriting to its memory cell can be started, and the rewriting test time using an LSI tester or the like can be shortened.

Third Embodiment

Figure 6:
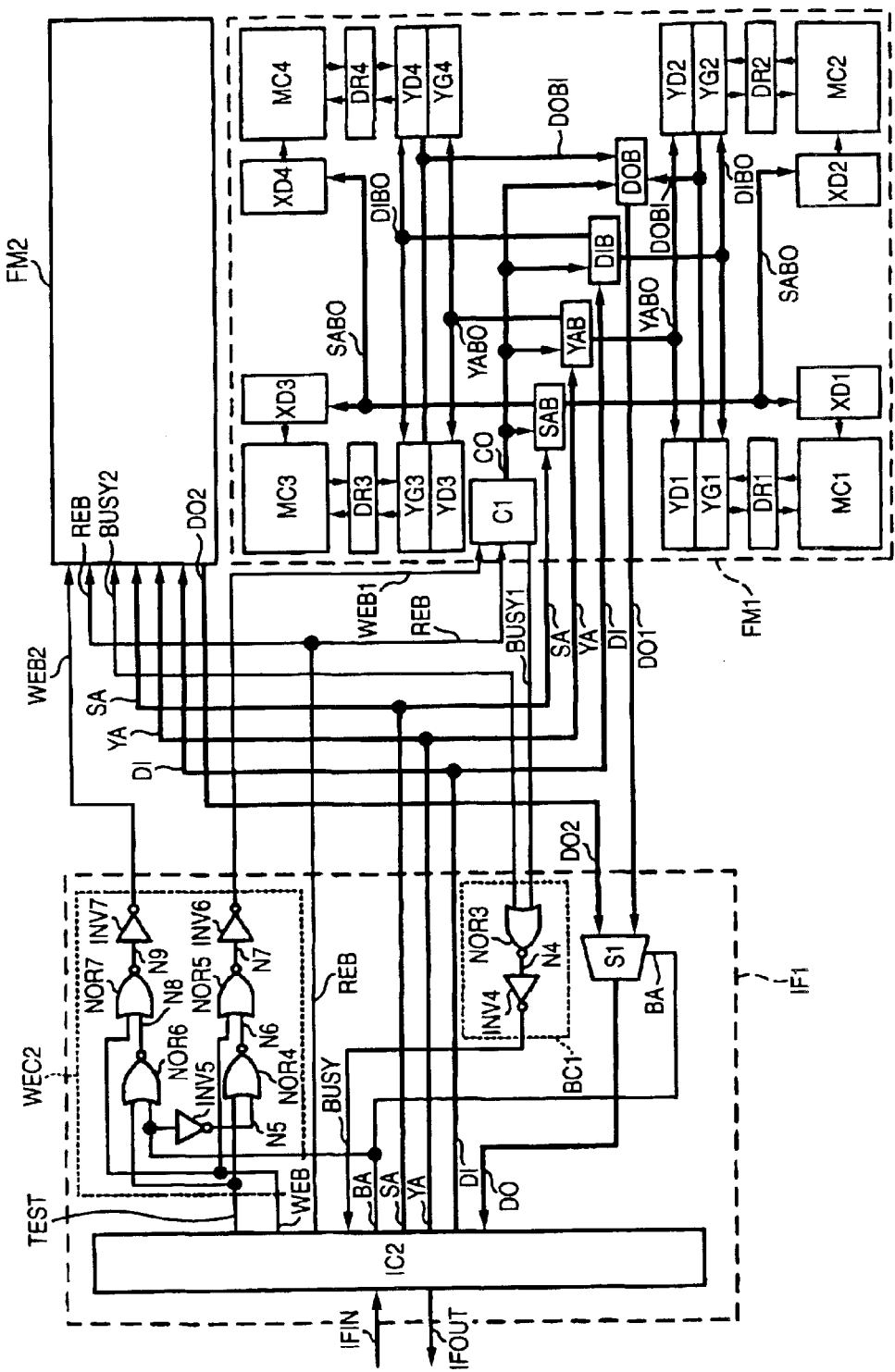
FIG. 6 is a block diagram schematically showing the structure of a flash module according to a third embodiment of the present invention.

FIG. 6 is a block diagram schematically showing the structure of a flash module according to a third embodiment of the present invention.

The structure of flash memories FM1 and FM2 is the same as the structure described in the first embodiment. External signals inputted to and outputted from the flash memories FM1 and FM2 are the same as those described in the first embodiment. The flash module (semiconductor memory device) according to the third embodiment includes the two flash memories (memory banks) FM1 and FM2, and one interface circuit IF3.

The interface circuit IF3 has an interface core block IC2, a write enable signal control circuit WEC2, a selector element S1, and a busy signal control circuit BC1.

The interface core block IC2 has a structure in which the interface core block IC1 of the first or second embodiment is additionally equipped with a function to output a test mode signal TEST. The interface core block IC2 outputs a write enable signal WEB, a bank address group BA and a test mode signal TEST to the write enable signal control circuit WEC2. The interface core block IC2 outputs the bank address group BA to the selector element S1. The interface core block IC2 outputs a read enable signal REB, a sector address group SA, a Y address group YA and an input data group DI to the flash memories FM1 and FM2. To the interface core block IC2, an output data group DOI is inputted from the selector element S1 and a busy signal BUSY indicating that the flash memory is performing a rewriting operation is inputted from the busy signal control circuit BC1. An external input signal IFIN, which is an input signal to the flash module, is also inputted to the interface core block IC2. The interface core block IC2 outputs an external output signal IFOUT, which is a flash module output signal.

The test mode signal TEST is a signal that can be switched from a ground potential Vss to a power-supply potential Vdd at the time of rewriting test of the flash memory using an LSI tester. The Structure of the selector element S1 of FIG. 6, the structure of the busy signal control circuit BC1 of FIG. 6 and the like are the same as those of the second embodiment.

The write enable signal control circuit WEC2 includes NOR elements NOR4 to NOR7 and inverter elements INV5 to INV7. The test mode signal TEST is inputted to one input terminal of each of the NOR elements NOR4 and NOR6. The bank address group BA is inputted to the other input terminal of each of the NOR elements NOR4 and NOR6 and to the input terminal of the inverter element INV5. An output of the inverter element INV5 is inputted to the other input terminal of the NOR element NOR4 via a node N5. Outputs of the NOR elements NOR4 and NOR6 are inputted to one-side input terminals of the NOR elements NOR5 and NOR7 via nodes N6 and N8, respectively. The write enable signal WEB is inputted to the other input terminal of each of the NOR elements NOR5 and NOR7. Outputs of the NOR elements NOR5 and NOR7 are inputted to the input terminals of the inverter elements INV6 and INV7 via nodes N7 and N9, respectively. Outputs of the inverter elements INV6 and INV7 are inputted to the flash memories FM1 and FM2 as write enable signals WEB1 and WEB2, respectively.

The interface circuit IF3 is so constituted that even when one of the flash memories FM1 and FM2 is performing the rewriting operation and its busy signal BUSY1 or BUSY2 and the busy signal BUSY have the power-supply potential Vdd, the other flash memory can be accessed for the rewriting operation.

A data reading operation in the flash module according to the third embodiment is the same as the data reading operation in the flash module according to the first embodiment.

Figure 7:
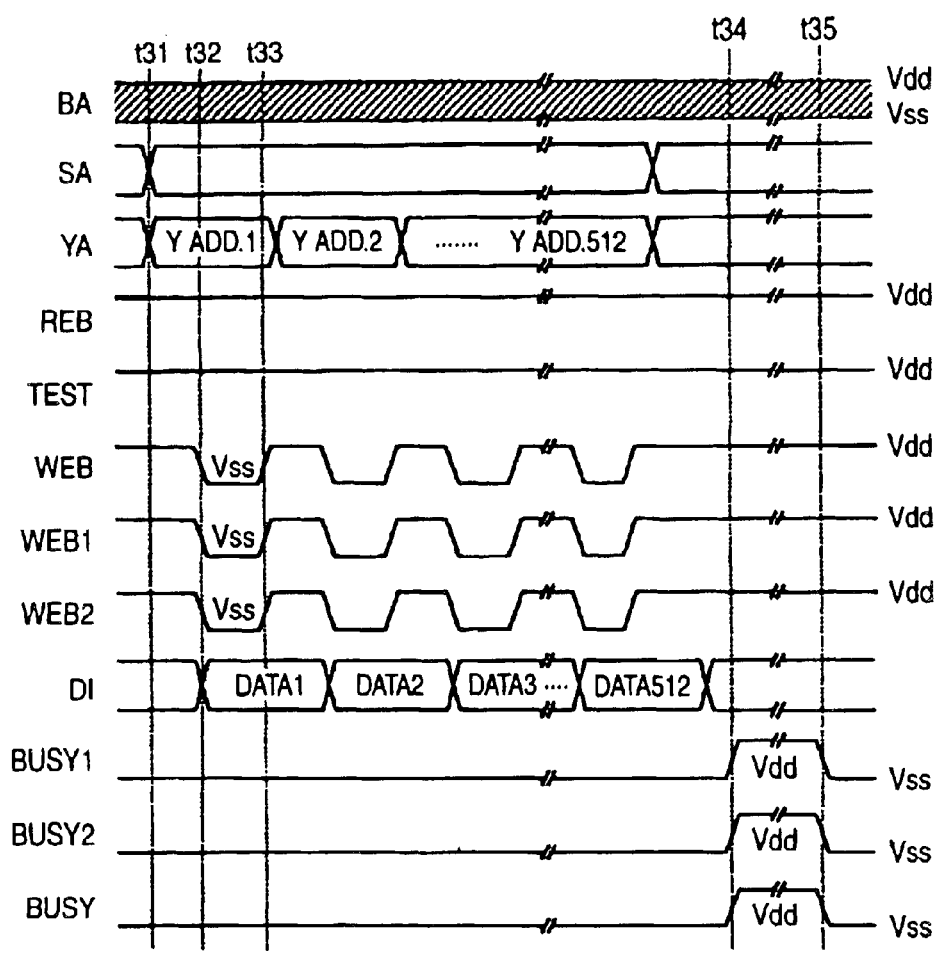
FIG. 7 is a timing chart for explaining a rewriting operation in the flash module of FIG. 6.

FIG. 7 is a timing chart for explaining the rewriting operation in the flash module of FIG. 6. In this case, an operation to simultaneously rewrite the same data in the flash memories FM1 and FM2 will be described with reference to rewriting of a memory cell in a sector of an arbitrary address, as an example.

As shown in FIG. 7, in the initial state, the write enable signal WEB has the power-supply voltage Vdd. The busy signals BUSY1 and BUSY2 have the ground potential Vss. The test mode signal TEST has the power-supply potential Vdd. The sector address group SA and the Y address group YA select arbitrary addresses. The input data group DI has arbitrary data. The nodes N6 and N8 have the ground potential Vss. The nodes N7 and N9 have the ground potential Vss. Both of the write enable signals WEB1 and WEB2 have the power-supply potential Vdd. The node N4 has the power-supply potential Vdd. The busy signal BUSY has the ground potential Vss. The bank address group BA may have either the power-supply potential Vdd or the ground potential Vss. During the rewriting operation period (rewriting operation mode), the read enable signal REB and the test mode signal TEST are held at the power-supply potential Vdd.

Next, the sector address group SA is switched to the address of a sector (word line) in which rewriting is to be executed, and the Y address group YA is switched to the address of the latch circuit of the data register blocks DR1 to DR4 to which data is to be loaded first (time point t31).

The bank address group BA and the sector address group SA maintain this state during the loading. When the write enable signal WEB is turned to the ground potential Vss, the nodes N7 and N9 are switched to the power-supply potential vdd and both of the write enable signals WEB1 and WBE2 are switched to the ground potential Vss. At the leading edge of these write enable signals WEB1 and WEB2, the latch circuits of the target ones of the data register blocks DR1 to DR4 in the flash memories FM1 and FM2 are selected, and the input data group DI becomes data to be loaded to the latch circuits (time point t32). The data to be loaded to the flash memories FM1 and FM2 are the same data.

Next, as the write enable signal WEB is switched to the power-supply potential Vdd, the nodes N7 and N9 are switched to the ground potential Vss and both of the write enable signals WEB1 and WEB2 are switched to the power-supply potential Vdd. At the leading edge of these write enable signals WEB1 and WEB2, the data of the input data group DI of the flash memories FM1 and FM2 are taken into the latch circuits of the target ones of data register blocks DR1 to DR4 (time point t33).

Next, the Y address group YA selects the address of the latch circuits of the data register blocks DR1 to DR4 of the flash memories FM1 and FM2 to which the second data is to be loaded, and in such a manner, an operation similar to the operation from the time point t31 to the time point t33 is executed to the latch circuits of all the data register blocks DR1 to DR4, for example, 512 cycles.

When data loading to the latch circuits of all the data register blocks DR1 to DR4 of the flash memories FM1 and FM2 is completed, the flash memories FM1 and FM2 themselves automatically start the rewriting operation to all the memory cells selected by the sector address group SA using the data of the data register blocks DR1 to DR4. The busy signals BUSY1 and BUSY2 are switched to the power-supply potential Vdd and the node N4 of the busy signal control circuit BC1 is switched to the ground potential Vss. The busy signal BUSY is switched to the power-supply potential Vdd (time point t34).

When the rewriting operation ends, the busy signals BUSY and BUSY2 are switched to the ground potential Vss and the node N4 is switched to the power-supply potential Vdd. The busy signal BUSY is switched to the ground potential Vss and the rewriting operation to the flash memories FM1 and FM2 is completed (time point t35).

In the case of executing the rewriting operation with the test mode signal TEST at the ground potential Vss, the write enable signal control circuit WEC2 has the same logic as that of the write enable signal control circuit WEC1 of the second embodiment and therefore the operation is the same as the operation described in the second embodiment. In this case, the operation-has effects similar to those of the second embodiment.

As described above, in the flash module according to the third embodiment, the function to output the bank address BA is added to the interface core block IC2 of the interface circuit IF3, and the selector element S1 and the write enable signal selector circuit WEC2 are additionally provided in the interface circuit IF3, thereby enabling control of the plural flash memories having the same structure as that of the conventional flash memory. Therefore, with the flash module according to the third embodiment, redesigning of the flash memories themselves is not necessary and it is possible to increase the scale of memory capacity of the memory cell arrays of the flash module simply by making a simple design change of the interface circuit. With the flash module according to the third embodiment, since the circuit change is thus minimized, development of the flash module can be made in a short period.

Moreover, in the third embodiment, by providing the circuit WEC2 for activating all the write enable signals WEB1 and WEB2 by switching the test mode signal TEST, which can be switched from the ground potential Vss to the power-supply potential Vdd at the time of rewriting test using an LSI tester, to the power-supply potential Vdd, it is possible to simultaneously write the same data to all of the provided plural flash memories at the time of rewriting test using an LSI tester, and the rewriting test time can be shortened.

In the case of executing rewriting with the test mode signal TEST at the ground potential Vss, the rewriting operation of different data to the plural flash memories is executed, and during data rewriting of the memory cell of one of the flash memories, data loading to the other flash memory and data rewriting to its memory cell can be started. The rewriting test time using an LSI tester or the like can be shortened.

In the first to third embodiments, the method for constructing the flash memory and the interface circuit in the flash-hybrid LSI is described. However, the present invention is not limited to this and can be applied to the structure of a memory such as DRAM or SRAM and its interface circuit.

Moreover, in the first to third embodiments, the method for constructing the two flash memories and the interface circuit is described. However, the present invention can also be applied to a method for constructing plural flash memories other than two and an interface circuit.

What is claimed is:

1. A semiconductor memory device comprising:

a plurality of memory banks each including a memory cell array and a control circuit for the memory cell array; and an interface circuit shared by the plural memory banks;

the semiconductor memory device being adapted for performing reading of data from the plural memory banks and rewriting of data to the plural memory banks, wherein in an operation mode for performing the reading, the following processing is performed:

processing A1 in which the interface circuit outputs an active read enable signal to the plural memory banks;

processing A2 in which the interface circuit outputs address information specifying a memory cell as a reading target to the plural memory banks;

processing A3 in which each of the plural memory banks reads out data of the memory cell specified by the inputted address information and outputs the read-out data as an output data group to the interface circuit; and processing A4 in which the interface circuit selectively outputs one of plural output data groups outputted from the plural memory banks, to outside, and in an operation mode for performing the rewriting, the following processing is performed:

processing B1 in which the interface circuit outputs address information specifying a memory cell as a rewriting target to the plural memory banks;

processing B2 in which the interface circuit outputs an input data group from outside to the plural memory banks;

processing B3 in which the interface circuit selectively outputs an active write enable signal to one of the plural memory banks; and processing B4 in which a memory bank to which an active write enable signal is inputted, of the plural memory banks, rewrites data of the memory cell specified by the address information to data of the input data group.

2. The semiconductor memory device as claimed in claim 1, wherein the memory bank to which an active write enable signal is inputted, of the plural memory banks, outputs a busy signal indicating that it is performing the processing B4.

3. The semiconductor memory device as claimed in claim 2, wherein the interface circuit does not activate the write enable signal during a period when a busy signal is received from at least one of the plural memory banks.

4. The semiconductor memory device as claimed in claim 2, wherein even during a period when a busy signal is received from at least one of the plural memory banks, the interface circuit outputs an active write enable signal to a memory bank that is not outputting a busy signal.

5. The semiconductor memory device as claimed in claim 1, wherein in a test mode for the plural memory banks, the following processing is performed:

processing C1 in which the interface circuit outputs address information specifying a memory cell as a rewriting target to the plural memory banks;

processing C2 in which the interface circuit outputs an input data group from outside to the plural memory banks;

processing C3 in which the interface circuit outputs an active write enable signal to the plural memory banks; and processing C4 in which the plural memory banks rewrite data of the memory cell specified by the address information to data of the input data group.

6. The semiconductor memory device as claimed in claim 2, wherein in a test mode for the plural memory banks, the following processing is performed:

processing D1 in which the interface circuit outputs address information specifying a memory cell as a rewriting target to the plural memory banks;

processing D2 in which the interface circuit outputs an input data group from outside to the plural memory banks; and processing D3 in which the interface circuit outputs an active write enable signal to one of the plural memoiy banks; and wherein the memory bank to which an active write enable signal is inputted, of the plural memory banks, rewrites data of the memory cell specified by the address information to data of the input data group, and even during a period when a busy signal is received from at least one of the plural memory banks, the interface circuit outputs an active write enable signal to a memory bank that is not outputting a busy signal.

7. The semiconductor memory device as claimed in claim 1, wherein the interface circuit comprises:
an interface core block for outputting a bank address for selecting one of the plural memory banks;
a selector element for selecting and outputting one of plural output data groups outputted from the plural memory banks on the basis of the bank address in the operation mode for performing the reading; and
a write enable signal control circuit for selecting one of the plural memory banks on the basis of the bank address and outputting an active write enable signal to the selected bank memory in the operation mode for performing the rewriting;
the processing A1, A2, B1 and B2 being performed by the interface core block; the processing A3 being performed by the selector element;
the processing B3 being performed by the write enable signal control circuit.

8. The semiconductor memory device as claimed in claim 5, wherein the interface circuit comprises:
an interface core block for outputting a bank address for selecting one of the plural memory banks;
a selector element for selecting and outputting one of plural output data groups outputted from the plural memory banks on the basis of the bank address in the operation mode for performing the reading; and
a write enable signal control circuit for selecting one of the plural memory banks on the basis of the bank address and outputting an active write enable signal to the selected bank memory in the operation mode for performing the rewriting;
the processing A1, A2, B1, B2, C1 and C2 being performed by the interface core block;
the processing A3 being performed by the selector element;
the processing B3 and C3 being performed by the write enable signal control circuit.

9. The semiconductor memory device as claimed in claim 6, wherein the interface circuit comprises:
an interface core block for outputting a bank address for selecting one of the plural memory banks;
a selector element for selecting and outputting one of plural output data groups outputted from the plural memory banks on the basis of the bank address in the operation mode for performing the reading; and
a write enable signal control circuit for selecting one of the plural memory banks on the basis of the bank address and outputting an active write enable signal to the selected bank memory in the operation mode for performing the rewriting;
the processing A1, A2, B1, B2, D1 and D2 being performed by the interface core block;
the processing A3 being performed by the selector element;
the processing B3 and D3 being performed by the write enable signal control circuit.

10. A semiconductor memory device comprising:
a plurality of memory banks each of which is controlled by a read enable signal and a write enable signal, the memory banks providing output data and a plurality of busy signals, respectively; and
an interface circuit connected to the memory banks, the interface circuit including:
an interface core block connected to the memory banks, the interface core block providing the read enable signal to the memory banks, the write enable signal and a bank address;
a write enable signal control circuit connected to the memory banks and the interface core block, the write enable signal control circuit providing a plurality of secondary write enable signals to the memory banks, respectively, in response to the write enable signal and the bank address;
a first select circuit connected to the memory banks and the interface core block, the first select circuit selectively supplying one of the busy signals in response to the bank address; and
a second select circuit connected to the memory banks and the interface core block, the second select circuit selectively supplying the output data in response to the bank address.

11. A semiconductor memory device according to claim 10, wherein each of the memory banks comprises:
a control circuit connected to the interface core block and the second select circuit, the control circuit receiving the write enable signal and providing one of the busy signals; and
a plurality of memory cells for providing the output data to the second select circuit.

12. A semiconductor memory device according to claim 10, wherein the write enable signal control circuit includes a plurality of inverters and a plurality of NOR circuits.

13. A semiconductor memory device according to claim 10, wherein the interface core block provides a test signal to the write enable signal control circuit, and wherein the write enable signal control circuit provides the secondary write enable signals to the memory banks, respectively, in response to the write enable signal, the test signal and the bank address.

14. A semiconductor memory device according to claim 13, wherein the write enable signal control circuit includes a plurality of inverters and a plurality of NOR circuits.

15. A semiconductor memory device comprising:
a plurality of memory banks each of which is controlled by a read enable signal and a write enable signal, the memory banks providing output data and a plurality of busy signals, respectively; and
an interface circuit connected to the memory banks, the interface circuit including:
an interface core block connected to the memory banks, the interface core block providing the read enable signal to the memory banks, the write enable signal and a bank address;
a write enable signal control circuit connected to the memory banks and the interface core block, the write enable signal control circuit providing a plurality of secondary write enable signals to the memory banks, respectively, in response to the write enable signal and the bank address;
a busy signal control circuit connected to the memory banks and the interface core block, the busy signal control circuit supplying a control signal in response to the busy signals; and
a select circuit connected to the memory banks and the interface core block, the select circuit selectively supplying the output data in response to the bank address.

16. A semiconductor memory device according to claim 15, wherein each of the memory banks comprises:

a control circuit connected to the interface core block and the busy signal control circuit, the control circuit receiving the write enable signal and providing one of the busy signals; and a plurality of memory cells for providing the output data to the select circuit.

17. A semiconductor memory device according to claim 15, wherein the write enable signal control circuit includes a plurality of inverters and a plurality of NOR circuits.

18. A semiconductor memory device according to claim 15, wherein the interface core block provides a test signal to the write enable control circuit, and wherein the write enable signal control circuit provides the secondary write enable signals to the memory banks, respectively, in response to the write enable signal, the test signal and the bank address.

19. A semiconductor memory device according to claim 18, wherein the write enable signal control circuit includes a plurality of inverters and a plurality of NOR circuits.

* * * * *